United States Patent
Son et al.

(10) Patent No.: US 12,137,596 B2
(45) Date of Patent: Nov. 5, 2024

(54) DISPLAY DEVICE

(71) Applicant: SAMSUNG DISPLAY CO., LTD., Yongin-si (KR)

(72) Inventors: Jungha Son, Yongin-si (KR); Gee-Bum Kim, Seoul (KR); Sangwoo Kim, Seoul (KR); Kijune Lee, Yongin-si (KR); Taekyung Ahn, Yongin-si (KR); Byung Han Yoo, Suwon-si (KR); Jaeik Lim, Hwaseong-si (KR); Chaungi Choi, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 798 days.

(21) Appl. No.: 17/297,442

(22) PCT Filed: Sep. 23, 2019

(86) PCT No.: PCT/KR2019/012320
§ 371 (c)(1),
(2) Date: Mar. 3, 2022

(87) PCT Pub. No.: WO2020/122376
PCT Pub. Date: Jun. 18, 2020

(65) Prior Publication Data
US 2022/0199698 A1    Jun. 23, 2022

(30) Foreign Application Priority Data
Dec. 13, 2018 (KR) .................. 10-2018-0161059

(51) Int. Cl.
*H10K 59/38* (2023.01)
*G06F 3/041* (2006.01)
(Continued)

(52) U.S. Cl.
CPC .......... *H10K 59/40* (2023.02); *G06F 3/0412* (2013.01); *G06F 3/0445* (2019.05);
(Continued)

(58) Field of Classification Search
CPC ........ H10K 59/38; H10K 59/40; H10K 59/80; H10K 59/122; H10K 59/131;
(Continued)

(56) References Cited

U.S. PATENT DOCUMENTS 8,687,273 B2    4/2014 Fukushima et al.
8,823,254 B2    9/2014 Ohta et al.
(Continued)

FOREIGN PATENT DOCUMENTS

CN    108735783 A    11/2018
CN    113169220 A    7/2021
(Continued)

OTHER PUBLICATIONS

Ofice Action dated Dec. 27, 2023 in corresponding CN Patent Application No. 201980082336.8 (6 pgs).
(Continued)

*Primary Examiner* — Chuong A Luu
(74) *Attorney, Agent, or Firm* — F. Chau & Associates, LLC

(57) ABSTRACT

The display device includes a display panel and an input detection member. The input detection member includes a first conductive pattern, a first insulating layer covering the first conductive pattern, a second conductive pattern disposed on the first insulating layer, and a second insulating layer covering the second conductive pattern. Both the first insulating layer and the second insulating layer include an organic material. The refractive index of the second insulating layer is greater than that of the first insulating layer.

20 Claims, 12 Drawing Sheets

(51) Int. Cl.
  *G06F 3/044*       (2006.01)
  *H10K 50/858*      (2023.01)
  *H10K 59/40*       (2023.01)
  *H10K 59/122*      (2023.01)

(52) U.S. Cl.
  CPC ......... *G06F 3/0446* (2019.05); *H10K 50/858* (2023.02); *H10K 59/122* (2023.02)

(58) Field of Classification Search
  CPC ............... H10K 59/879; H10K 59/858; H10K 2102/351; G06F 3/041; G06F 3/044; G06F 3/0412; G06F 3/0445; G06F 3/0446; G06F 3/0443; G06F 2203/041; G06F 2203/04111; G06F 2203/0412
  USPC .......................................................... 257/88
  See application file for complete search history.

(56) References Cited

U.S. PATENT DOCUMENTS

| | | | |
|---|---|---|---|
| 8,901,587 B2 | 12/2014 | Ohta | |
| 10,338,449 B2 | 7/2019 | Kang et al. | |
| 10,707,280 B2 | 7/2020 | Jeong et al. | |
| 10,761,664 B2 | 9/2020 | Kwon et al. | |
| 11,599,229 B2 | 3/2023 | Son et al. | |
| 2015/0346856 A1* | 12/2015 | Wassvik | G06F 3/042 |
| | | | 345/175 |
| 2016/0363491 A1 | 12/2016 | Iwase et al. | |
| 2020/0259113 A1* | 8/2020 | Takahashi | H10K 50/15 |

FOREIGN PATENT DOCUMENTS

| | | |
|---|---|---|
| JP | 4933553 | 5/2012 |
| JP | 5373054 | 12/2013 |
| JP | 5523354 | 6/2014 |
| KR | 10-2017-0001935 | 1/2017 |
| KR | 10-2017-0077942 A | 7/2017 |
| KR | 10-2017-0089448 | 8/2017 |
| KR | 10-2017-0113033 | 10/2017 |
| KR | 10-2018-0005327 | 1/2018 |
| KR | 10-2018-0059010 | 6/2018 |
| KR | 10-2018-0119198 | 11/2018 |

OTHER PUBLICATIONS

International Search Report issued in corresponding application No. PCT/KR2019/012320 on Dec. 27, 2019.

* cited by examiner

DISPLAY DEVICE

CROSS-REFERENCE TO RELATED APPLICATIONS

This application is a National Stage application of PCT KR2019/012320 filed Sep. 23, 2019, which in turns claims priority from Korean Application No. 10-2018-0161059 filed Dec. 13, 2018, the contents of which are incorporated herein in their entirety.

BACKGROUND

Technical Field

The present disclosure relates to a display device, and more particularly, to a display device with improved light efficiency.

Description of the Related Art

In the information age, display devices are gaining importance as a medium for delivering visual information. Currently known display devices include a liquid crystal display (LCD), a plasma display panel (PDP), an organic light emitting display (OLED), a field effect display (FED), and an electrophoretic display (EPD).

For example, in the case of an OLED, not all light generated by a light emitting device is emitted to the front of the display, as some of the light is emitted to the side. Accordingly, the light efficiency of the display device is reduced.

SUMMARY

The inventive concept reduces a loss of light generated by a light emitting device by minimizing emission of light to the side of a display.

Technical Solution

A display device according to an embodiment of the inventive concept may include a display panel and an input sensor disposed on the display panel.

The display panel may include a plurality of anode electrodes disposed on a base layer, a pixel defining layer in which a plurality of first opening parts exposing the plurality of anode electrodes are defined, and a sealing layer disposed on the pixel defining layer; and The input sensor may include a first conductive pattern, a first insulating layer, a second conductive pattern, and a second insulating layer. The first conductive pattern may be disposed on the sealing layer. The first insulating layer may be disposed on the sealing layer to cover the first conductive pattern, include a plurality of second opening parts defined to respectively correspond to the plurality of first opening parts, include a first organic material, and have a first refractive index. The second conductive pattern may be disposed on the first insulating layer. The second insulating layer may be configured to cover the second conductive pattern and the first insulating layer, include a second organic material, and have a second refractive index greater than the first refractive index.

According to an embodiment of the inventive concept, a through-hole exposing at least a portion of the first conductive pattern may be defined in the first insulating layer, and the second conductive pattern and the first conductive pattern may be electrically connected through the through-hole.

According to an embodiment of the inventive concept, the second conductive pattern may include a plurality of first sensors, a first connection pattern electrically connecting two adjacent first sensors among the plurality of first sensors, and a plurality of second sensors electrostatically coupled to the plurality of first sensors. The first conductive pattern may include a second connection pattern electrically connecting two adjacent second sensors among the plurality of second sensors.

According to an embodiment of the inventive concept, a plurality of touch-opening parts each overlapping with the anode electrodes may be defined in the plurality of first sensors and the plurality of second sensors.

According to an embodiment of the inventive concept, the first refractive index ranges from about 1.45 to about 1.55, and the second refractive index ranges from about 1.60 to about 1.70.

According to an embodiment of the inventive concept, a difference between the second refractive index and the first refractive index ranges from about 0.1 to about 0.25.

According to an embodiment of the inventive concept, each of the first organic material and the second organic material may be an acrylic resin.

According to an embodiment of the inventive concept, the second insulating layer may further include zirconia.

According to an embodiment of the inventive concept, a thickness of the first insulating layer ranges from about 1.3 µm to about 1.7 µm, and a thickness of the second insulating layer ranges from about 4 µm to about 5.5 µm.

According to an embodiment of the inventive concept, the input sensor may further include a buffer layer disposed between the sealing layer and the first insulating layer, the buffer layer may include SiNx, and the first conductive pattern may be in contact with one surface of the buffer layer.

According to an embodiment of the inventive concept, a thickness of the buffer layer ranges from about 190 nm to about 210 nm.

According to an embodiment of the inventive concept, the first insulating layer may include a through surface defining each of the plurality of second opening parts, and an angle formed by the through surface with the sealing layer ranges from about 60 degrees to about 80 degrees.

A display device according to an embodiment of the inventive concept includes a display panel including a plurality of light emitting devices, and an input sensor disposed on the display panel.

The input sensor may include a first conductive pattern, a first insulating layer, a second conductive pattern, and a second insulating layer. The first conductive pattern may be disposed on the base layer. The first insulating layer may be disposed on the base layer to cover the first conductive pattern, include a plurality of opening parts defined to respectively correspond to the plurality of light emitting devices, include a first organic material, and have a first refractive index. The second conductive pattern may be disposed on the first insulating layer. The second insulating layer may be configured to cover the second conductive pattern and the first insulating layer, include a second organic material, and have a second refractive index greater than the first refractive index.

Advantageous Effects

According to an embodiment of the inventive concept, it is possible to provide a display device having a high light efficiency by reducing the loss of light generated by a light emitting device without being emitted to the outside.

In addition, it is possible to increase the efficiency of the light-generating process.

DETAILED DESCRIPTION

Figure 1:
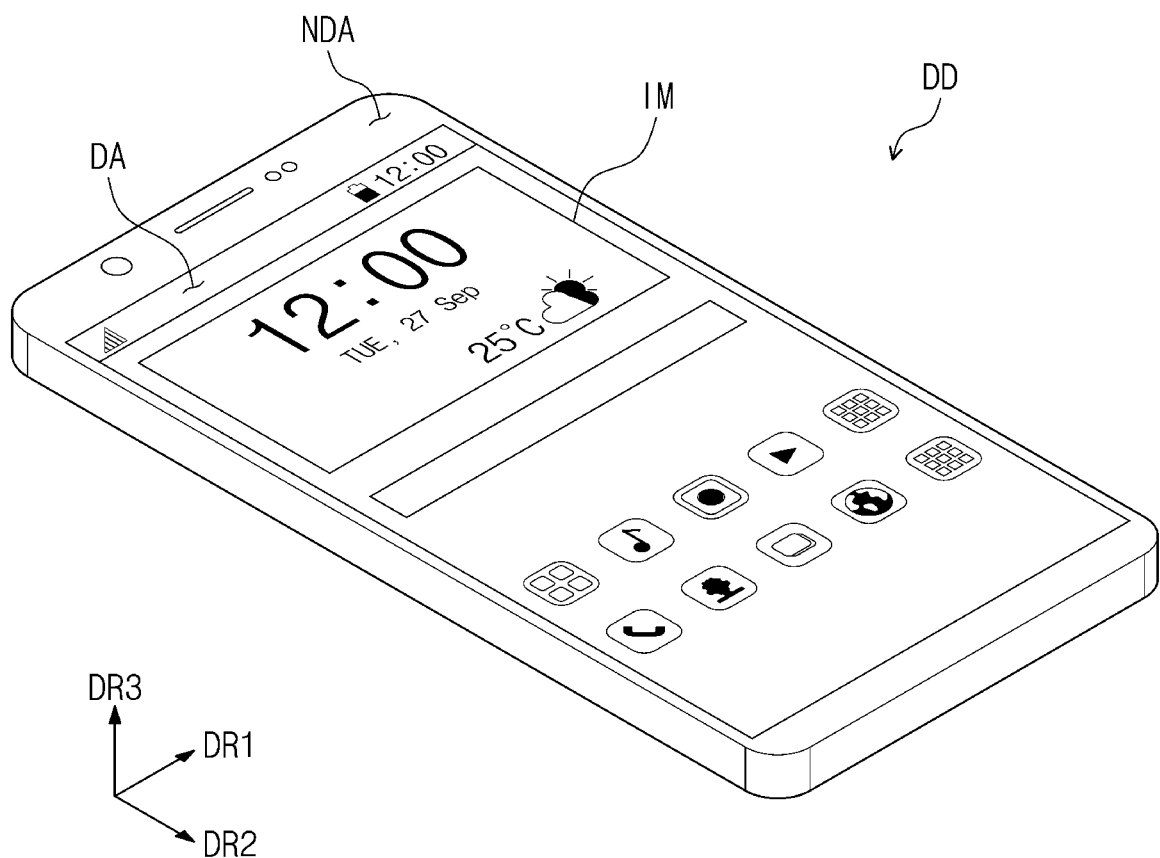
FIG. 1 is a perspective view of a display device according to an embodiment of the inventive concept.

Hereinafter, embodiments of the inventive concept will be described with reference to the drawings.

In the drawings, ratios and dimensions of components are exaggerated for effective description of technical content. "And/or" includes all of one or more combinations defined by related components.

In various embodiments of the inventive concept, the term "include" specifies a property, a region, a fixed number, a step, a process, an element and/or a component but does not exclude other properties, regions, fixed numbers, steps, processes, elements and/or components.

FIG. 1 is a perspective view of a display device DD according to an embodiment of the inventive concept.

FIG. 1 illustrates that the display device DD is a smartphone. However, the inventive concept is not limited thereto, and the display device DD may be any small and medium-sized electronic device such as a mobile phone, a tablet, a car navigation system, a game machine, a smart watch, and the like in addition to a large electronic device such as a television, a monitor, and the like.

A display area DA and a non-display area NDA may be defined in the display device DD.

The display area DA in which an image IM is displayed is parallel to a plane defined by a first direction axis DR1 and a second direction axis DR2. The third direction axis DR3 indicates the normal direction of the display area DA, that is, the thickness direction of the display device DD. The front surface (or upper surface) and the rear surface (or lower surface) of each member are divided by the third direction axis DR3. However, the directions indicated by the first to third direction axes DR1, DR2, and DR3 are relative concepts and may be converted to other directions. Hereinafter, the first to third direction refer to the same reference numerals as directions indicated by the first to third direction axes DR1, DR2, and DR3, respectively.

The shape of the display area DA illustrated in FIG. 1 is exemplary, and the shape of the display area DA may be changed without limitation as needed.

The non-display area NDA is an area adjacent to the display area DA, and is an area in which the image IM is not displayed. The bezel area of the display device DD may be defined by the non-display area NDA.

The non-display area NDA may surround the display area DA. However, the inventive concept is not limited thereto, and the shape of the display area DA and the shape of the non-display area NDA may be relatively designed.

FIGS. 2A to 2D are cross-sectional views of a display device DD according to an embodiment of the inventive concept. FIGS. 4A and 4B illustrate cross sections defined by the first direction DR1 and the third direction DR3. FIGS. 2A to 2D are schematically illustrated to explain a stacking relationship of functional panels and/or functional members constituting the display device DD.

Figure 2A:
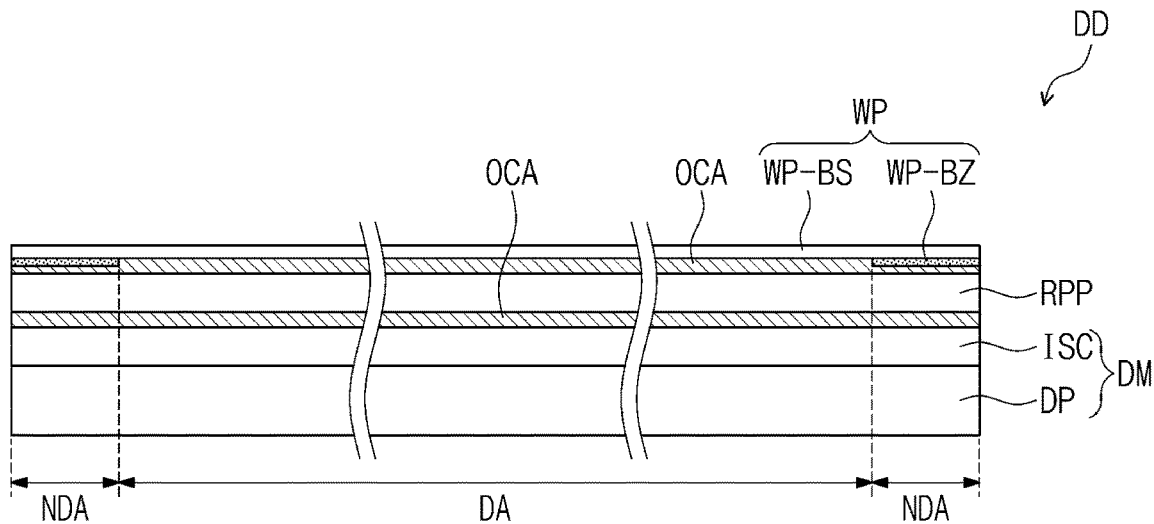
FIGS. 2A, 2B, 2C, and 2D are cross-sectional views of a display device according to an embodiment of the inventive concept.

As shown in FIG. 2A, the display device DD may include a display panel DP, an input sensor ISC (or input detection circuit), an antireflection member RPP, and a window member WP. The input sensor ISC may be directly disposed on the display panel DP. In the present specification, "directly arranged" means that a separate adhesive layer/adhesive member is not arranged between the two components.

The display module DM may be defined including the display panel DP and the input sensor ISC directly disposed on the display panel DP. An optically transparent adhesive member OCA is disposed between the display module DM and the antireflection member RPP, and between the antireflection member RPP and the window member WP.

The display panel DP generates an image, and the input sensor ISC acquires coordinate information of an external input (e.g., a touch event or applied pressure). Although not shown in the drawings separately, the display module DM according to an embodiment of the inventive concept may further include a protection member disposed on a lower surface of the display panel DP. The protection member and the display panel DP may be coupled through an adhesive member. The display devices DD of FIGS. 2B to 2D described below may also further include a protection member.

The display panel DP according to an embodiment of the inventive concept may be a light emitting display panel. For example, the display panel DP may be an organic light emitting display panel, a quantum dot light emitting display panel, or a micro LED display panel. The light emitting layer of the organic light emitting display panel may include an organic light emitting material. The light emitting layer of the quantum dot light emitting display panel may include quantum dot, quantum rod, and the like. Hereinafter, the display panel DP is described as the organic light emitting display panel.

The antireflection member RPP reduces the reflectance of external light incident from the upper side of the window member WP. The antireflection member RPP according to an embodiment of the inventive concept may include a phase retarder and a polarizer. An antireflection member RPP according to an embodiment of the inventive concept may include color filters.

The window member WP according to an embodiment of the inventive concept includes a base film WP-BS and a light blocking pattern WP-BZ. The base film WP-BS may include glass and/or synthetic resin. The base film WP-BS is not limited to a single layer. The base film WP-BS may include two or more films joined by an adhesive member.

The light blocking pattern WP-BZ partially overlaps the base film WP-BS. The light blocking pattern WP-BZ may be disposed on the rear surface of the base film WP-BS to define a bezel area of the display device DD, that is, a non-display area NDA.

Hereinafter, the light blocking pattern WP-BZ and the base film WP-BS are not separately shown in FIGS. 2B to 2D.

Figure 2B:
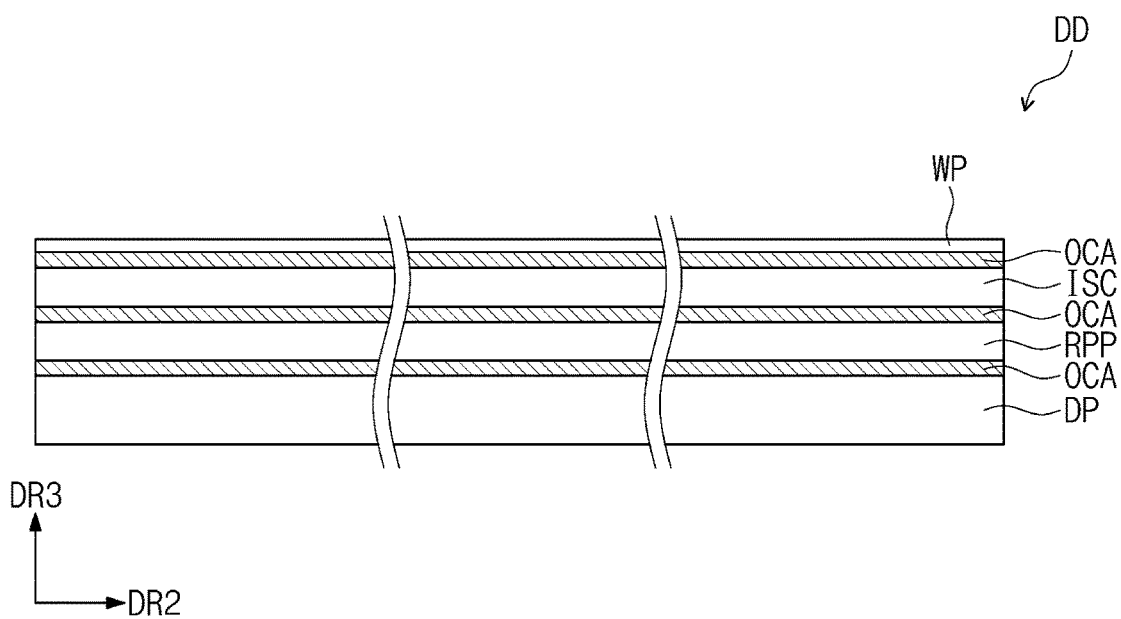

As shown in FIG. 2B, the display device DD may include a display panel DP, an antireflection member RPP, an input sensor ISC, and a window member WP.

The display panel DP and the antireflection member RPP may be coupled by an optically transparent adhesive member OCA. The antireflection member RPP and the input sensor ISC may be coupled by an optically transparent adhesive member OCA. The input sensor ISC and the window member WP may be coupled by an optically transparent adhesive member OCA.

Figure 2C:
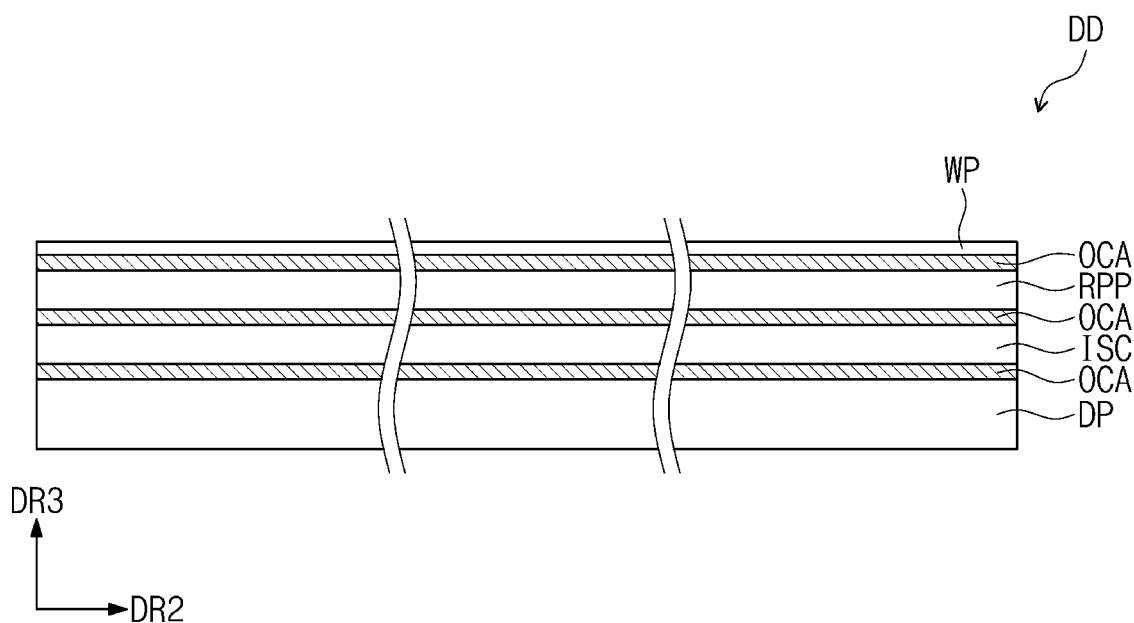

Referring to FIG. 2C, unlike the stacked structure illustrated in FIG. 2B, the positions of the antireflection member RPP and the input sensor ISC are changed.

Figure 2D:
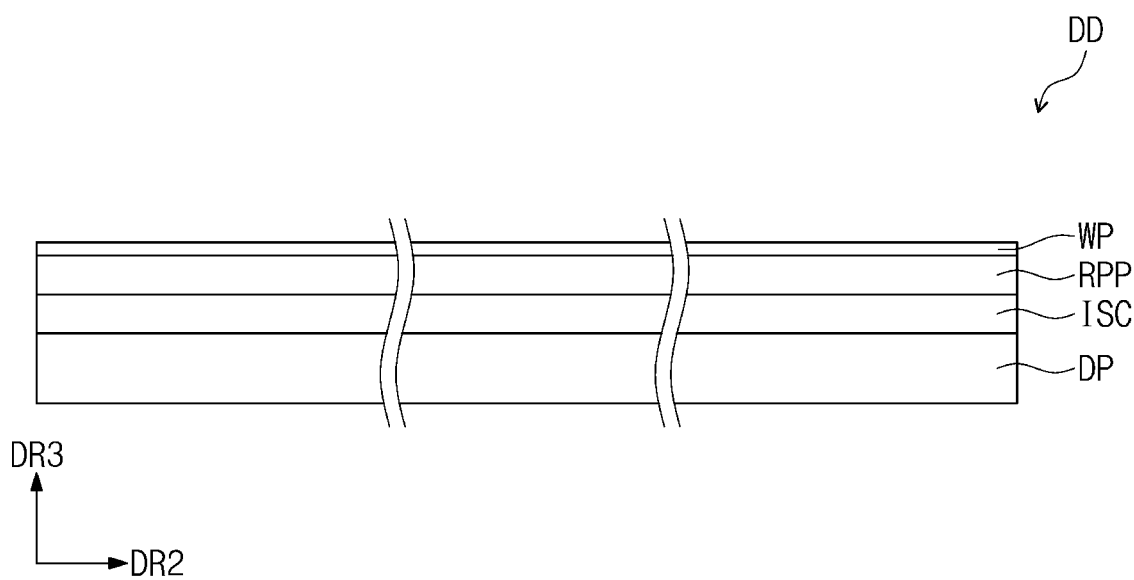

As shown in FIG. 2D, adhesive members are omitted from the display device DD, and the display panel DP, the input sensor ISC, the antireflection member RPP, and the window member WP may be formed in a continuous process. In an embodiment of the inventive concept, the stacking order of the input sensor ISC and the antireflection member RPP may be changed.

The input sensor ISC may be a circuit that detects a user's touch or externally applied pressure.

Figure 3:
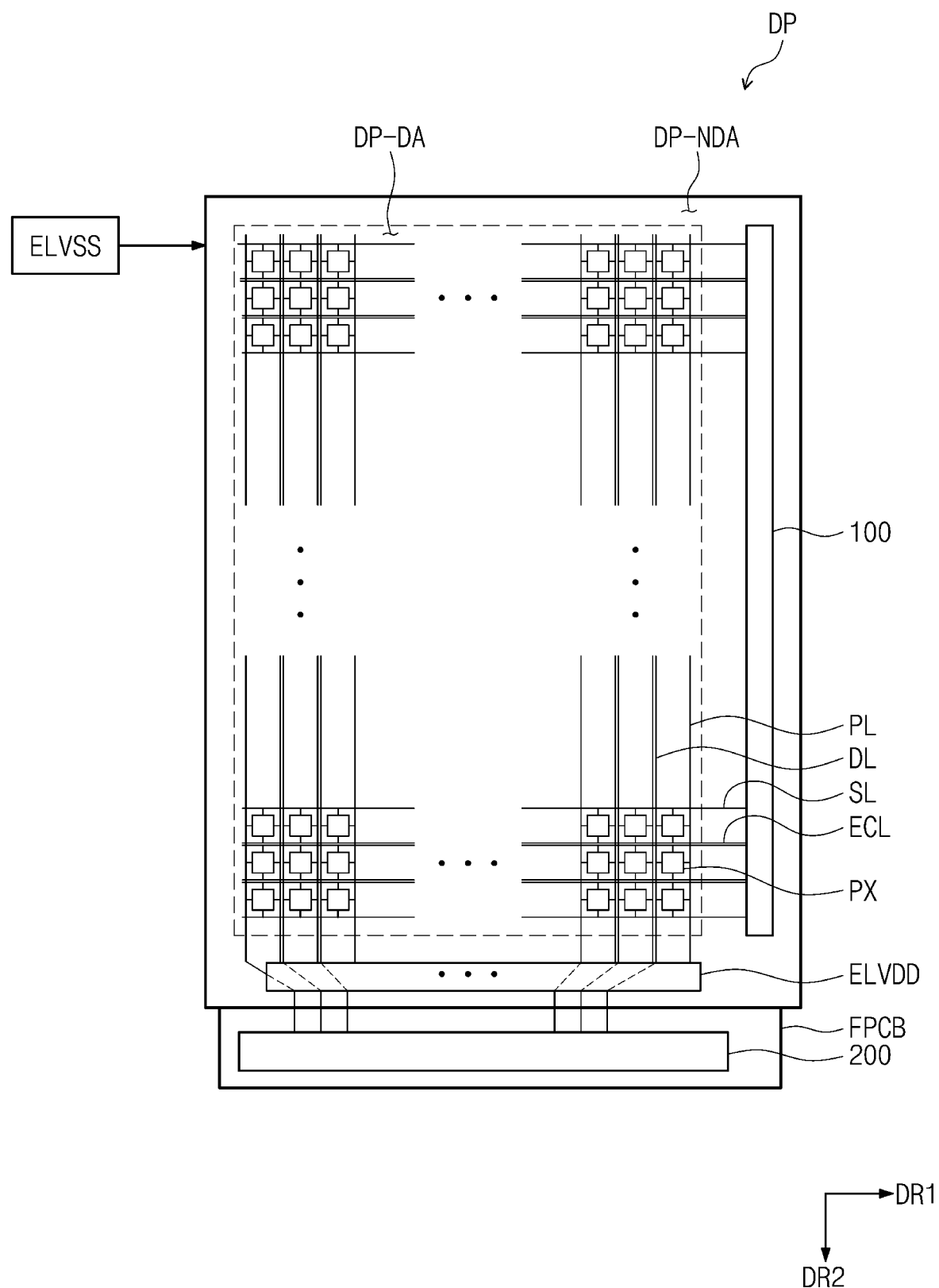
FIG. 3 is a plan view of a display panel according to an embodiment of the inventive concept.

FIG. 3 is a plan view of a display panel DP according to an embodiment of the inventive concept.

The display panel DP includes a display area DP-DA and a non-display area DP-NDA on a plane. In the present embodiment, the non-display area DP-NDA may be defined along the edge of the display area DP-DA. The display area DP-DA and the non-display area DP-NDA of the display panel DP may correspond to the display area DA and the non-display area NDA of the display device DD shown in FIG. 1, respectively.

The display panel DP may include a scan driving part 100, a data driving part 200, a plurality of scan lines SL, a plurality of emission control lines ECL, a plurality of data lines DL, a plurality of power lines PL, and a plurality of pixels PX (hereinafter referred to as pixels). The pixels PX are disposed in the display area DP-DA. Each of the pixels PX includes an organic light emitting device OLED (see FIG. 4) and a pixel circuit CC (see FIG. 4) connected thereto.

The scanning driving part 100 may include a scanning driving part and a light emission control driving part.

The scan driving part generates scan signals and sequentially outputs the generated scan signals to the scan lines SL. The light emission control driving part generates light emission control signals and outputs the generated light emission control signals to the light emission control lines ECL.

In an embodiment of the inventive concept, the scanning driving part and the light emission control driving part are not distinguished within the scanning driving part 100 and may be configured as one circuit.

The scanning driving part 100 may include a plurality of thin film transistors formed through the same process as the driving circuit of the pixels PX, for example, a Low Temperature Polycrystaline Silicon (LTPS) process or a Low Temperature Polycrystalline Oxide (LTPO) process.

The data driving part 200 outputs data signals to the data lines DL. The data signals are analog voltages corresponding to grayscale values of image data.

In an embodiment of the inventive concept, the data driving part 200 is mounted on a printed circuit board FPCB, and the printed circuit board FPCB may be connected to pads disposed at one end of the data lines DL. However, the inventive concept is not limited thereto, and the data driving part 200 may be directly mounted on the display panel DP.

The scan lines SL may extend in the first direction DR1 and may be arranged in the second direction DR2.

The light emission control lines ECL extend in the first direction DR1 and may be arranged in the second direction DR2. That is, each of the light emission control lines ECL may be arranged parallel to a corresponding scan line among the scan lines SL.

The data lines DL extend in the second direction DR2 and are arranged in the first direction DR1. The data lines DL may provide data signals to the corresponding pixels PX.

The power lines PL extend in the second direction DR2 and are arranged in the first direction DR1. The power lines PL may provide the first power ELVDD to the corresponding pixels PX.

Each of the plurality of pixels PX is connected to a corresponding scan line among the scan lines SL, a corresponding light emission control line among the light emission control lines ECL, a corresponding data line among the data lines DL, and a corresponding power line among the power lines PL.

Figure 4:
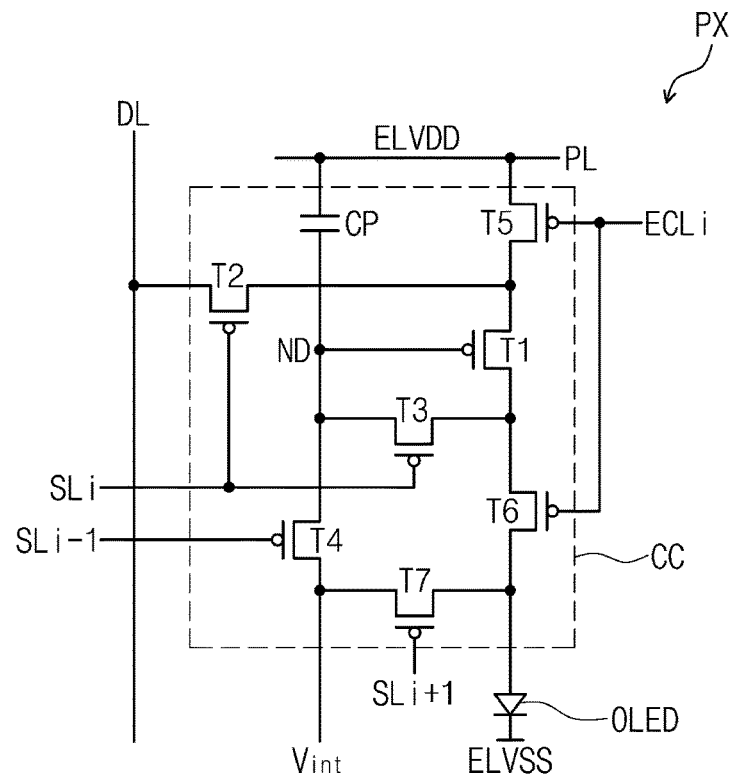
FIG. 4 is an equivalent circuit diagram of a pixel according to an embodiment of the inventive concept.
Figure 5:
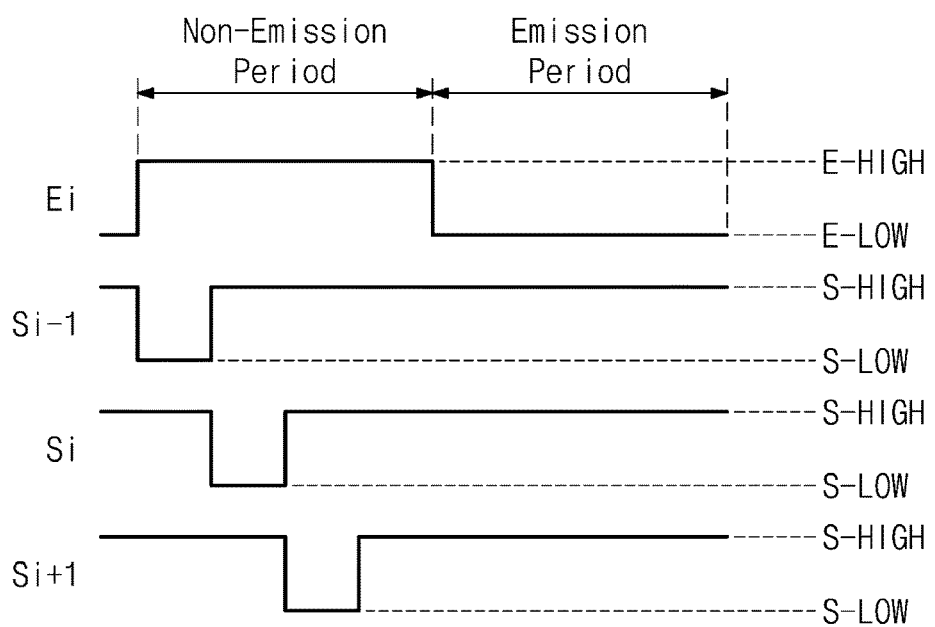
FIG. 5 exemplarily illustrates signals applied to a pixel of FIG. 4.

FIG. 4 is an equivalent circuit diagram of a pixel PX according to an embodiment of the inventive concept. FIG. 5 exemplarily shows a light emission control signal Ei and scan signals Si−1, Si, and Si+1 applied to the pixel PX of FIG. 4. FIG. 4 illustrates an example of a pixel PX connected to an i-th scan line SLi and an i-th light emission control line ECLi.

The pixel PX may include an organic light emitting device OLED and a pixel circuit CC. The pixel circuit CC may include a plurality of transistors T1 to T7 and a capacitor CP. The pixel circuit CC controls the amount of current flowing through the organic light emitting device OLED in response to a data signal.

The organic light emitting device OLED may emit light with a predetermined luminance corresponding to the amount of current provided from the pixel circuit CC. For this, the level of the first power ELVDD may be set higher than the level of the second power ELVSS.

Each of the plurality of transistors T1 to T7 may include an input electrode (or a source electrode), an output electrode (or a drain electrode), and a control electrode (or a gate electrode). In the present specification, for convenience, one of the input electrode and the output electrode may be referred to as a first electrode, and the other may be referred to as a second electrode.

The first electrode of the first transistor T1 is connected to the first power ELVDD through the fifth transistor T5, and the second electrode is connected to the anode electrode of the organic light emitting device OLED through the sixth transistor T6. The first transistor T1 may be referred to as a driving transistor in this specification.

The first transistor T1 controls the amount of current flowing through the organic light emitting device OLED in response to a voltage applied to the control electrode.

The second transistor T2 is connected between the data line DL and the first electrode of the first transistor T1. In addition, the control electrode of the second transistor T2 is connected to the i-th scan line SLi. The second transistor T2 is turned on when the i-th scan signal Si is provided to the i-th scan line SLi to electrically connect the data line DL and the first electrode of the first transistor T1.

The third transistor T3 is connected between the second electrode of the first transistor T1 and the control electrode. The control electrode of the third transistor T3 is connected to the i-th scan line SLi. The third transistor T3 is turned on when the i-th scan signal Si is provided to the i-th scan line SLi to electrically connect the second electrode of the first transistor T1 and the control electrode. Accordingly, when the third transistor T3 is turned on, the first transistor T1 is connected in the form of a diode.

The fourth transistor T4 is connected between the node ND and an initialization power generation part (not shown). In addition, the control electrode of the fourth transistor T4 is connected to the (i−1)-th scan line SLi−1. The fourth transistor T4 is turned on when the (i−1)-th scan signal Si−1 is provided to the (i−1)-th scan line SLi−1 to provide an initialization voltage Vint to the node ND.

The fifth transistor T5 is connected between the power line PL and the first electrode of the first transistor T1. The control electrode of the fifth transistor T5 is connected to the i-th light emission control line ECLi.

The sixth transistor T6 is connected between the second electrode of the first transistor T1 and the anode electrode of the organic light emitting device OLED. In addition, the control electrode of the sixth transistor T6 is connected to the i-th light emission control line ECLi.

The seventh transistor T7 is connected between the initialization power generation part (not shown) and the anode electrode of the organic light emitting device OLED. In addition, the control electrode of the seventh transistor T7 is connected to the (i+1)-th scan line SLi+1. The seventh transistor T7 is turned on when the (i+1)-th scan signal Si+1 is provided to the (i+1)-th scan line SLI+1 to provide the initialization voltage Vint to the anode electrode of the organic light emitting device OLED.

The seventh transistor T7 may improve the black expression capability of the pixel PX. Specifically, when the seventh transistor T7 is turned on, the parasitic capacitor (not shown) of the organic light emitting device OLED is discharged. Then, when the black luminance is implemented, the organic light emitting device OLED does not emit light due to the leakage current from the first transistor T1, and accordingly, the black expression capability may be increased.

Additionally, in FIG. 4, the control electrode of the seventh transistor T7 is shown to be connected to the (i+1)-th scan line SLi+1, but the inventive concept is not limited thereto. In an embodiment of the inventive concept, the control electrode of the seventh transistor T7 may be connected to the i-th scan line SLi or the (i−1)-th scan line SLi−1.

In FIG. 4, the PMOS is illustrated, but the inventive concept is not limited thereto. In an embodiment of the inventive concept, the pixel PX may be formed of an NMOS. In an embodiment of the inventive concept, the pixel PX may be configured by a combination of NMOS and PMOS.

The capacitor CP is disposed between the power line PL and the node ND. The capacitor CP stores a voltage corresponding to the data signal. When the fifth transistor T5 and the sixth transistor T6 are turned on, the amount of current flowing through the first transistor T1 may be determined according to the voltage stored in the capacitor CP.

In the inventive concept, the structure of the pixel PX is not limited to the structure shown in FIG. 4. In an embodiment of the inventive concept, the pixel PX may be implemented in various forms for allowing the organic light emitting device OLED to emit light.

Referring to FIG. 5, the light emission control signal Ei may have a high level E-HIGH or a low level E-LOW. Each of the scan signals SLi−1, SLi, and SLi+1 may have a high level S-HIGH or a low level S-LOW.

When the light emission control signal Ei has a high level E-HIGH, the fifth transistor T5 and the sixth transistor T6 are turned off. When the fifth transistor T5 is turned off, the power line PL and the first electrode of the first transistor T1 are electrically cut off. When the sixth transistor T6 is turned off, the second electrode of the first transistor T1 and the anode electrode of the organic light emitting device OLED are electrically cut off. Accordingly, the organic light emitting device OLED does not emit light while the light emission control signal Ei having a high level E-HIGH is provided to the i-th light emission control line ECLi.

Thereafter, when the (i−1)-th scan signal Si−1 provided to the (i−1)-th scan line SLi−1 has a low level S-LOW, the fourth transistor T4 is turned on. When the fourth transistor T4 is turned on, the initialization voltage Vint is provided to the node ND.

When the i-th scan signal Si provided to the i-th scan line SLi has a low level S-LOW, the second transistor T2 and the third transistor T3 are turned on.

When the second transistor T2 is turned on, a data signal is provided to the first electrode of the first transistor T1. At this time, since the node ND is initialized to the initialization voltage Vint, the first transistor T1 is turned on. When the first transistor T1 is turned on, a voltage corresponding to the data signal is provided to the node ND. At this time, the capacitor CP stores a voltage corresponding to the data signal.

When the (i+1)-th scan signal Si+1 provided to the (i+1)-th scan line SLi+1 has a low level (S-LOW), the seventh transistor T7 is turned on.

When the seventh transistor T7 is turned on, the initialization voltage Vint is provided to the anode electrode of the organic light emitting device OLED, thereby discharging the parasitic capacitor of the organic light emitting device OLED.

When the light emission control signal Ei provided to the light emission control line ECLi has a low level E-LOW, the fifth transistor T5 and the sixth transistor T6 are turned on. When the fifth transistor T5 is turned on, the first power ELVDD is provided to the first electrode of the first transistor T1. When the sixth transistor To is turned on, the second electrode of the first transistor T1 and the anode electrode of the organic light emitting device OLED are electrically connected. Then, the organic light emitting device OLED generates light of a predetermined luminance in response to the amount of supplied current.

Figure 6:
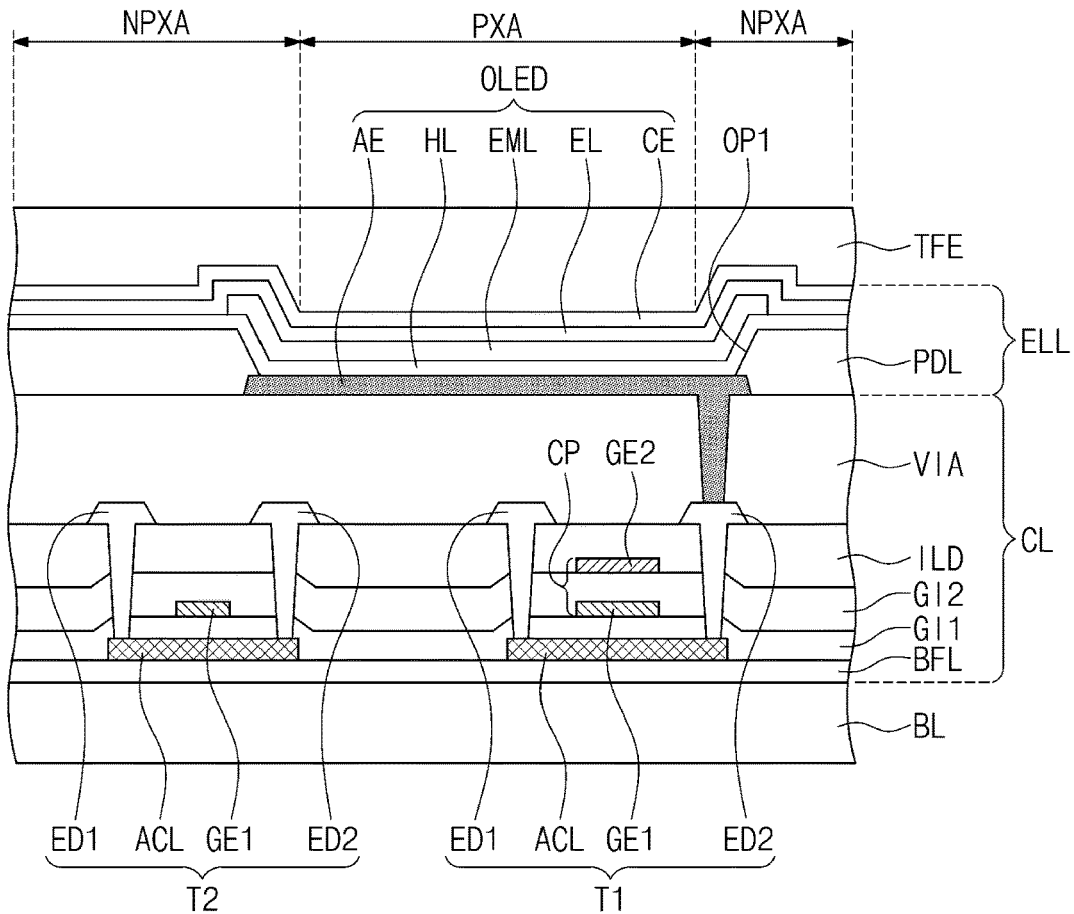
FIG. 6 is a cross-sectional view of a portion of a pixel according to an embodiment of the inventive concept.

FIG. 6 is a cross-sectional view of a portion of a pixel PX (refer to FIG. 4) according to an embodiment of the inventive concept. In FIG. 6, the first transistor T1 and the second transistor T2 are illustrated as an example, but the structures of the first transistor T1 and the second transistor T2 are not limited thereto. In FIG. 6, the second electrode ED2 of the first transistor T1 is shown to directly contact the anode electrode AB but this is a cross-sectional shape and is thus shown, and in fact, as shown in FIG. 4, the first transistor T1 may be connected to the anode electrode AE through the sixth transistor T6. However, the inventive concept is not limited thereto, and in an embodiment of the inventive concept, the second electrode ED2 of the first transistor T1 may directly contact the anode electrode AE.

The display panel DP (see FIG. 3) may include a base layer BL, a circuit layer CL, a light emitting device layer ELL, and a sealing layer TFE.

The circuit layer CL may include a buffer layer BFL, gate insulating layers GI1 and GI2, an interlayer insulating layer ILD, a circuit insulating layer VIA, and transistors T1 and T2.

The light emitting device layer EL may include an organic light emitting device OLED and a pixel defining layer PDL. The first opening part OP defined in the pixel definition layer PDL may expose the anode electrode AE of the organic light emitting device OLED.

The sealing layer TFE seals the light emitting device layer ELL to protect the light emitting device layer ELL from external oxygen or moisture. The sealing layer TFE may be a layer in which an organic layer and an inorganic layer are mixed.

In this specification, an area of the display area DA through which light generated by the organic light emitting device OLED is emitted to the outside is defined as a pixel area PXA, and an area other than the pixel area PXA may be defined as a non-pixel area NPXA.

A buffer layer BFL is disposed on one surface of the base layer BL.

The buffer layer BFL prevents impurities existing in the base layer BL from flowing into the pixel PX during the manufacturing process. In particular, diffusion of impurities into the active parts ACL of the transistors T1 and T2 constituting the pixel PX is prevented.

Impurities may be introduced from the outside or may be generated by thermal decomposition of the base layer BL. The impurity may be gas or sodium discharged from the base layer BL. In addition, the buffer layer BFL blocks moisture flowing into the pixel PX from the outside.

The active parts ACL constituting each of the transistors T1 and T2 are disposed on the buffer layer BFL. Each of the active parts ACL may include polysilicon or amorphous silicon. Other active parts ACL may include a metal oxide semiconductor.

The active parts ACL may include a channel area serving as a passage through which electrons or holes may move, and a first ion-doped area and a second ion-doped area disposed with the channel area therebetween.

A first gate insulating layer GI1 is disposed on the buffer layer BFL to cover the active parts ACL. The first gate insulating layer GI1 includes an organic layer and/or an inorganic layer. The first gate insulating layer GI1 may include a plurality of inorganic thin films. The plurality of inorganic thin films may include a silicon nitride layer and a silicon oxide layer.

Control electrodes GE1 constituting each of the transistors T1 and T2 are disposed on the first gate insulating layer GI1. The control electrode GE1 of the first transistor T1 may be any one of two electrodes constituting the capacitor CP. At least a portion of the scan lines SL (refer to FIG. 3) and the light emission control lines ECL (refer to FIG. 3) may be disposed on the first gate insulating layer GI1.

A second gate insulating layer GI2 is disposed on the first gate insulating layer GI1 to cover the control electrodes GE1. The second gate insulating layer GI2 includes an organic layer and/or an inorganic layer. The second gate insulating layer GI2 may include a plurality of inorganic thin films. The plurality of inorganic thin films may include a silicon nitride layer and a silicon oxide layer.

The other electrode GE2 among the two electrodes constituting the capacitor CP (refer to FIG. 4) may be disposed on the second gate insulating layer GI2. That is, the control electrode GE1 disposed on the first gate insulating layer GI1 and the electrode GE2 disposed on the second gate insulating layer GI2 overlap to form the capacitor CP shown in FIG. 4. However, the structure in which the electrodes constituting the capacitor CP are disposed is not limited thereto.

An interlayer insulating layer ILD covering the electrode GE2 is disposed on the second gate insulating layer GI2. The interlayer insulating layer ILD includes an organic layer and/or an inorganic layer. The interlayer insulating layer ILD may include a plurality of inorganic thin films. The plurality of inorganic thin films may include a silicon nitride layer and a silicon oxide layer.

At least a portion of the data line DL (refer to FIG. 3) and the power line PL (refer to FIG. 3) may be disposed on the interlayer insulating layer ILD. First electrodes ED1 and second electrodes ED2 of each of the transistors T1 and T2 may be disposed on the interlayer insulating layer ILD.

The first electrodes ED1 and the second electrodes ED2 may be connected to the corresponding active parts ACL through contact holes penetrating the gate insulating layers GI1 and GI2 and the interlayer insulating layer ILD, respectively.

A circuit insulating layer VIA covering the first electrodes ED1 and the second electrodes ED2 is disposed on the interlayer insulating layer ILD. The circuit insulating layer VIA includes an organic layer and/or an inorganic layer. The circuit insulating layer VIA may provide a flat surface.

A pixel defining layer PDL and an organic light emitting device OLED are disposed on the circuit insulating layer VIA.

The organic light emitting device OLED may include an anode electrode AE, a hole control layer HL, a light emitting layer EML, an electronic control layer EL, and a cathode electrode CE.

Figure 7:
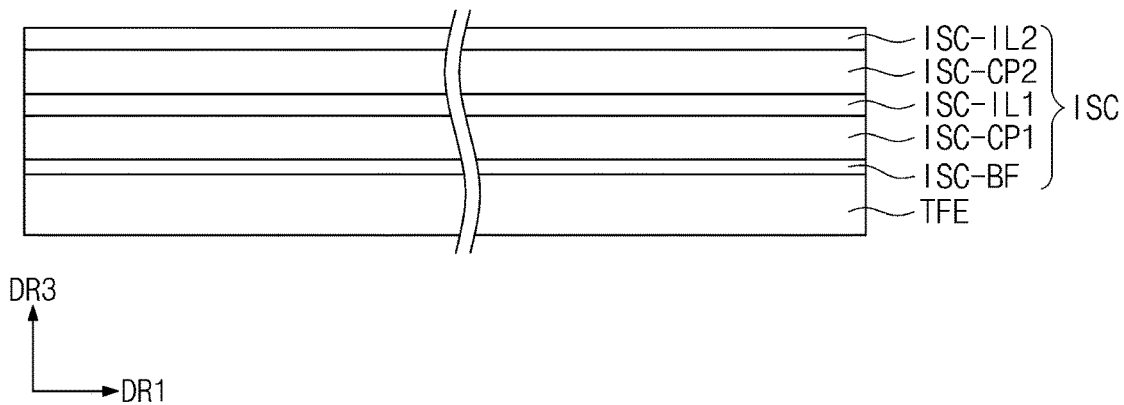
FIG. 7 is a cross-sectional view of an input sensor according to an embodiment of the inventive concept.

FIG. 7 is a cross-sectional view of an input sensor ISC according to an embodiment of the inventive concept.

As shown in FIG. 7, the input sensor ISC may include a silicon-buffer layer ISC-BF, a first conductive pattern ISC-CP1, a first insulating layer ISC-IL1, a second conductive pattern ISC-CP2, and a second insulating layer ISC-IL2.

The silicon-buffer layer ISC-BF may include silicon nitride (SINx).

However, the inventive concept is not limited thereto, and in an embodiment of the inventive concept, the silicon-buffer layer ISC-BF may be omitted. In this case, the first conductive pattern ISC-CP1 may be directly disposed on the thin film sealing layer TFE. That is, the first conductive pattern ISC-CP1 may contact the thin film sealing layer TFE.

At least a portion of the second conductive pattern ISC-CP2 may insulately cross the first conductive pattern ISC-CP1 with the first insulating layer ISC-IL1 therebetween. The other part of the second conductive pattern ISC-CP2 may be electrically connected to the first conductive pattern ISC-CP1 through a through-hole CTH (see FIG. 10b) defined in the first insulating layer ISC-IL1.

Each of the first conductive pattern ISC-CP1 and the second conductive pattern ISC-CP2 may have a single layer structure or may have a multilayer structure stacked along the third direction axis DR3.

Each of the first insulating layer ISC-IL1 and the second insulating layer ISC-IL2 includes an organic material. In the case of the inventive concept, the characteristics of the refractive index of each of the first insulating layer ISC-IL1 and the second insulating layer ISC-IL2 are used. Therefore, both the first insulating layer ISC-IL1 and the second insulating layer ISC-IL2 may include an organic material.

The organic material may include at least one of acrylic resin, methacrylic resin, polyisoprene, vinyl resin, epoxy resin, urethane resin, cellulose resin, siloxane resin, polyimide resin, polyamide resin, and perylene resin.

In an embodiment of the inventive concept, the second insulating layer ISC-IL2 may further include zirconia.

The first insulating layer ISC-IL1 is sufficient to insulate at least a portion of the first conductive pattern ISC-CP1 and the second conductive pattern ISC-CP2 from each other, and the shape thereof is not limited. In an embodiment of the inventive concept, the first insulating layer ISC-IL1 may entirely cover the thin film sealing layer TFE or may include a plurality of insulating patterns.

Figure 8:
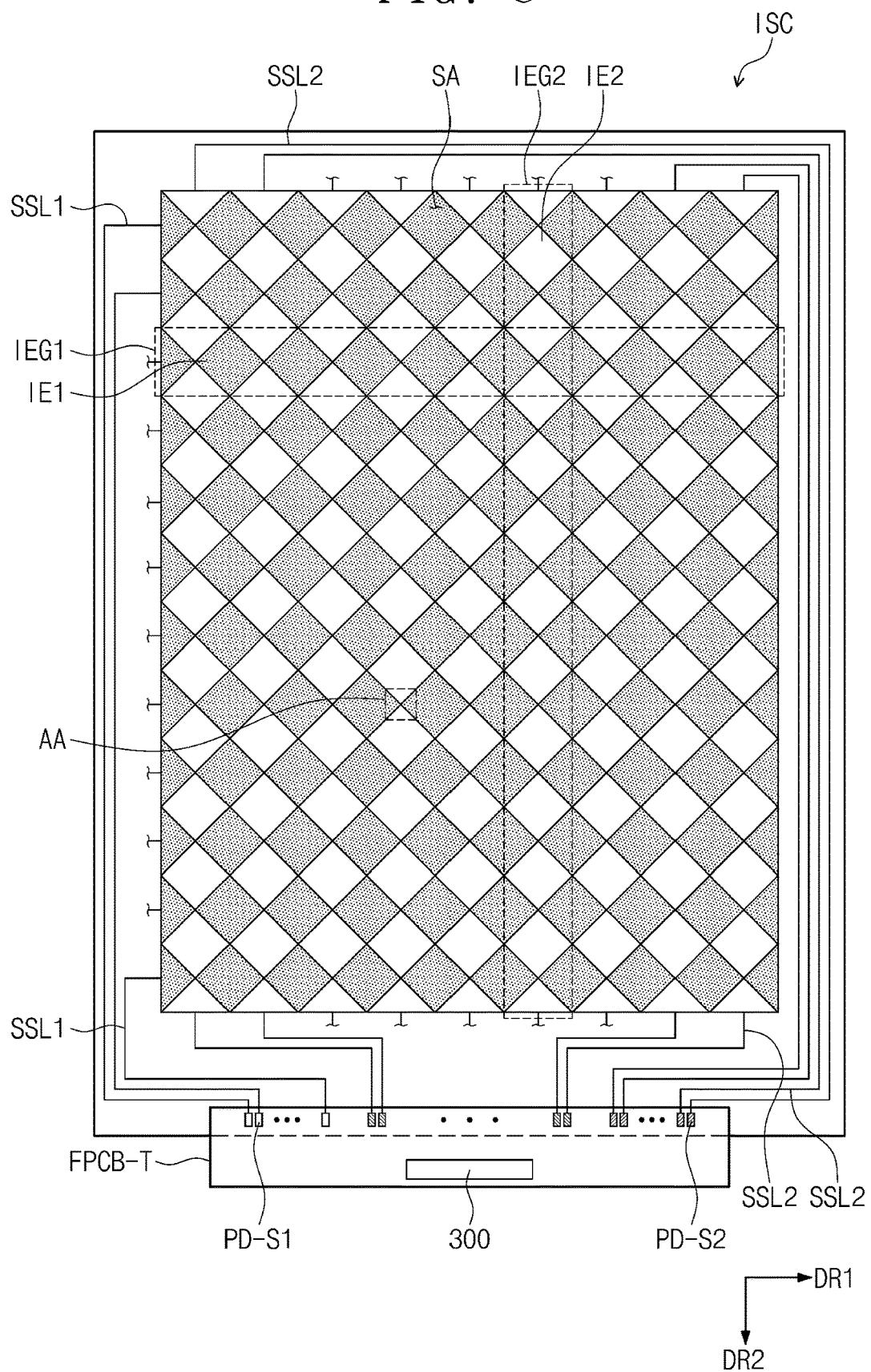
FIG. 8 is a plan view of an input sensor according to an embodiment of the inventive concept.

FIG. 8 is a plan view of an input sensor ISC according to an embodiment of the inventive concept.

An input detection area SA, which is an area capable of detecting an external input, may be defined in the input sensor ISC.

The input sensor ISC may include first sensor groups IEG1, second sensor groups LEG2, first signal lines SSL1, second signal lines SSL2, signal pads PD-S1 and PD-S2, a printed circuit board FPCB-T, and an input detection driving part 300.

Each of the first sensor groups IEG1 may extend in a first direction DR, and the first sensor groups IEG1 may be arranged in a second direction DR2. Each of the first sensor groups IEG1 may include a plurality of first sensor patterns IE1 (hereinafter, referred to as a first sensor). For example, the first sensor IE1 may be an Rx sensor.

Each of the second sensor groups IBG2 may extend in a second direction DR2, and the second sensor groups IEG2 may be arranged in a first direction DR1. Each of the second sensor groups IEG2 may include a plurality of second sensor patterns IE2 (hereinafter, referred to as a second sensor). For example, the second sensor IE2 may be a Tx sensor.

In an embodiment of the inventive concept, a length measured by the first sensor group IEG1 in the first direction DR1 may be shorter than a length measured by the second sensor group IEG2 in the second direction DR2. However, the inventive concept is not limited thereto.

In an embodiment of the inventive concept, each of the first sensors IE1 may be electrostatically coupled to adjacent second sensors IE2 among the second sensors IE2 to form a capacitance. In an embodiment of the inventive concept, each of the first sensors IE1 and the second sensors IE2 may be electrostatically coupled with an external object (e.g., a human finger) to form a capacitance.

In an embodiment of the inventive concept, the input sensor ISC detects a change in capacitance formed between the first sensors IE1 and the second sensors IE2 to determine whether an external input is applied. In an embodiment of the inventive concept, the input sensor ISC detects a change in capacitance formed between the first sensors IE1 and the second sensors IE2 and an external object to determine whether an external input is applied.

The first signal lines SSL1 may be electrically connected to the first sensor groups IEG1, respectively. In an embodiment of the inventive concept, the first signal lines SSL1 may be connected to the first sensor groups IEG1 in a single routing structure. However, the inventive concept is not limited thereto.

The second signal lines SSL2 may be electrically connected to the second sensor groups IEG2, respectively. In an embodiment of the inventive concept, the second signal lines SSL2 may be connected to the second sensor groups IEG2 in a double routing structure. However, the inventive concept is not limited thereto. In an embodiment of the inventive concept, the second signal lines SSL2 may be connected to the second sensor groups TEG2 in a single routing structure.

The first signal pads PD-S1 may be connected to the first signal lines SSL1. The second signal pads PD-S2 may be connected to the second signal lines SSL2.

The printed circuit board FPCB-T may be electrically connected to the signal pads PD-S1 and PD-S2.

The input detection driving part 300 may be mounted on a printed circuit board FPCB-T. The input detection driving part 300 may transmit/receive or calculate an electrical signal for determining whether a user's touch occurs and whether a pressure is applied to the input detection area SA.

Figure 9:
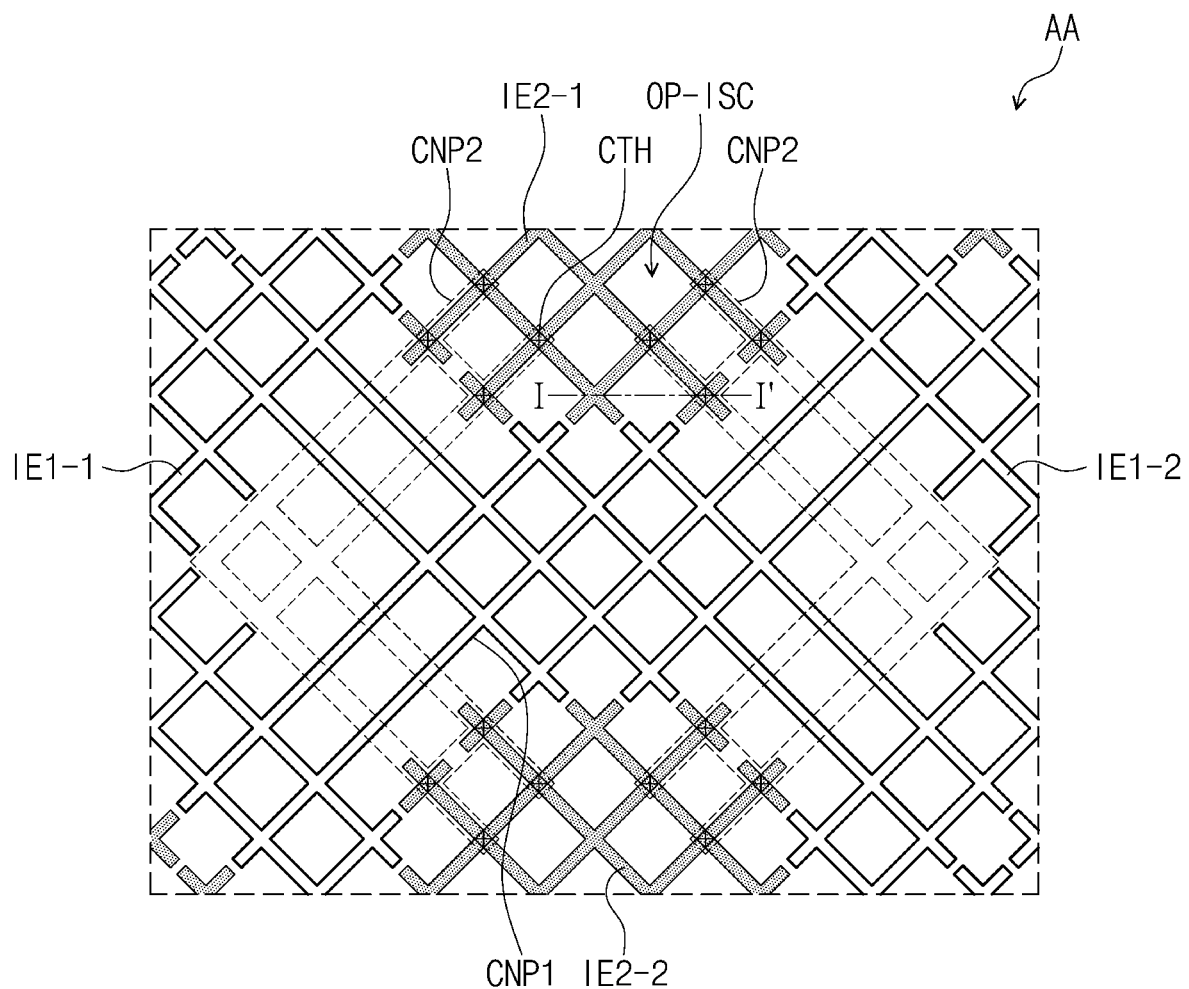
FIG. 9 is an enlarged view of an area AA of FIG. 8.
Figure 10A:
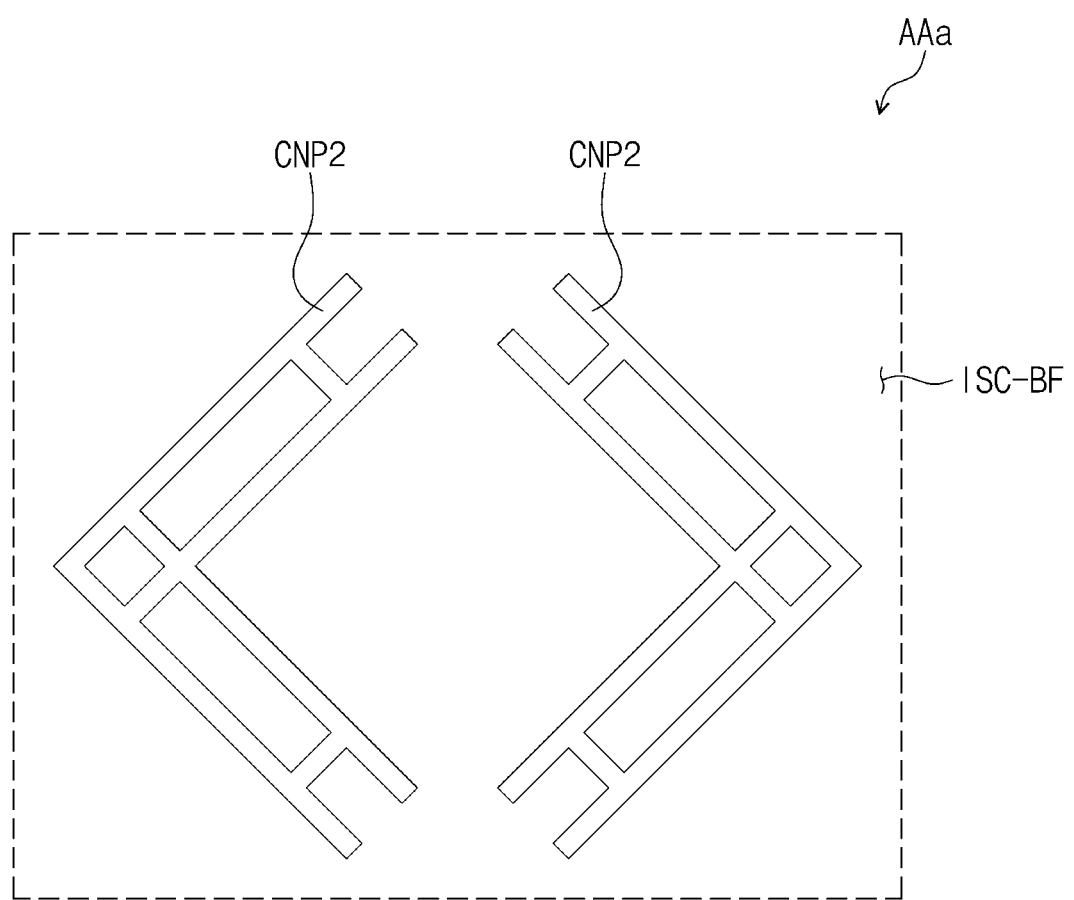
FIGS. 10A, 10B, and 10B each show an area AA of FIG. 8 for each layer.
Figure 10B:
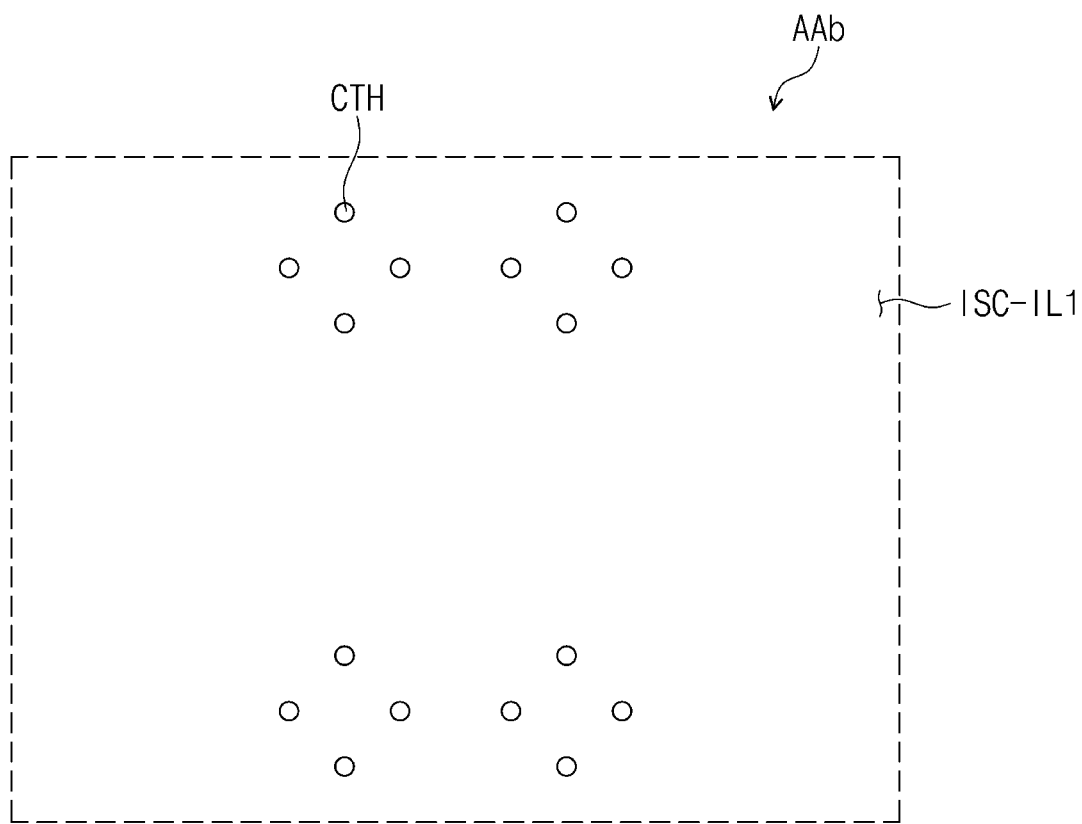
Figure 10C:
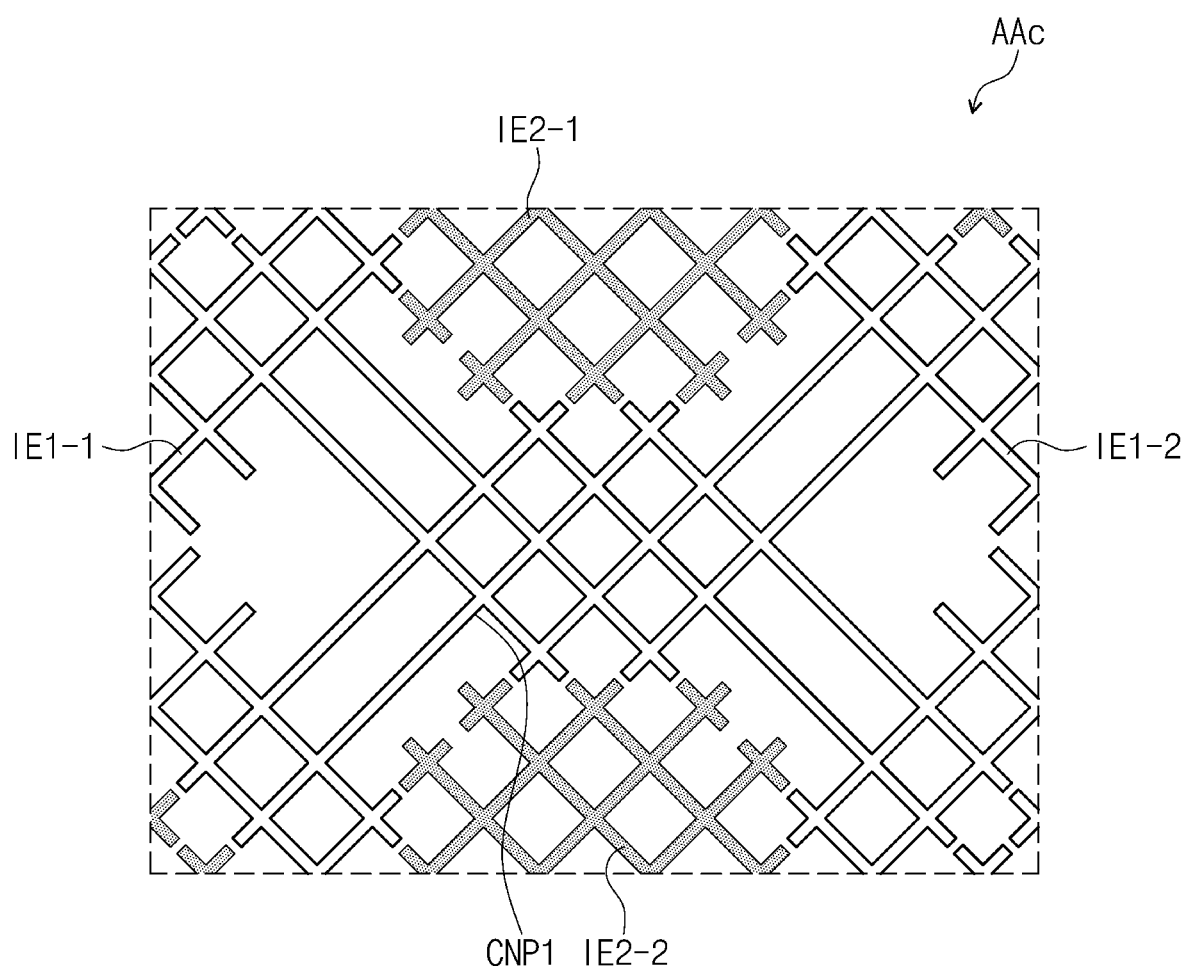

FIG. 9 is an enlarged view of an area AA of FIG. 8. FIGS. 10A, 10B, and 10C each show the area AA of FIG. 8 for each layer.

The area AAa of FIG. 10A shows a portion of the first conductive pattern ISC-CP1 corresponding to the area AA. The area AAb of FIG. 10B shows a portion of the first insulating layer ISC-IL1 corresponding to the area AA. The area AAc of FIG. 10C shows a portion of the second conductive pattern ISC-CP2 corresponding to the area AA.

FIGS. 7, and 9 to 10C illustrate an embodiment in which the first conductive pattern ISC-CP1 is disposed below the second conductive pattern ISC-CP2, but the inventive concept is not limited thereto. In an embodiment of the inventive concept, the second conductive pattern ISC-CP2 may be disposed below the first conductive pattern ISC-CP1.

The second conductive pattern ISC-CP2 may include first sensors IE1-1 and IE1-2, second sensors IE2-1 and IE2-2, and a first connection pattern CNP1. The first conductive pattern ISC-CP1 may include a second connection pattern CNP2.

The second connection pattern CNP2 may be disposed on the silicon-buffer layer ISC-BF.

The second connection pattern CNP2 is a pattern for connecting two adjacent second sensors IE2 (refer to FIG. 8).

Referring to FIG. 10B, a plurality of contact holes CTH may be defined in the first insulating layer ISC-IL1. The contact holes CTH may expose a portion of the second connection pattern CNP2. Specifically, the contact holes CTH may expose both ends of the second connection pattern CNP2.

In FIG. 10B, 16 contact holes CTH are exemplarily illustrated, but are not limited thereto, and the number of contact holes CTH may be changed as necessary.

Referring to FIGS. 7 and 10C, the first sensors IE1-1 and IE1-2, the second sensors IE2-1 and IE2-2, and the first connection pattern CNP1 may be disposed on a first insulating layer ISC-IL1.

The left first sensor IE1-1 and the right first sensor IE1-2 may be electrically connected by the first connection pattern CNP1.

The upper second sensor IE2-1 and the lower second sensor IE2-2 may be electrically connected to the second connection pattern CNP2 through the contact holes CTH of the first insulating layer ISC-IL1. That is, the upper second sensor IE2-1 and the lower second sensor IE2-2 may be electrically connected by the second connection pattern CNP2.

The first connection pattern CNP1 may be disposed between the upper second sensor IE2-1 and the lower second sensor IE2-2. The first connection pattern CNP1 may be insulated from the upper second sensor IE2-1 and the lower second sensor TE2-2.

Referring to FIG. 9, a direction between the first direction DR1 and the second direction DR2 may be defined as a fourth direction DR4. The fifth direction DR5 may be defined as a direction orthogonal to the fourth direction DR4. For example, the fourth direction DR4 may form 45 degrees with each of the first and second directions DR1 and DR2. The fifth direction DR5 may form 45 degrees with the first direction DR1 and 135 degrees with the second direction DR2.

In the area AA, wirings constituting the first conductive pattern ISC-CP1 and the second conductive pattern ISC-CP2 may extend in a direction parallel to the fourth direction DR4 or the fifth direction DR5.

In the area AA, a plurality of touch-opening parts OP-ISC may be defined between wirings constituting the first conductive pattern ISC-CP1 and the second conductive pattern ISC-CP2. In an embodiment of the inventive concept, the touch-opening parts OP-ISC may correspond to pixels PX (refer to FIG. 3), respectively.

Each of the touch-opening parts OP-ISC may pass light generated by the organic light emitting device OLED (see FIG. 4) of the pixel PX (see FIG. 4). That is, the touch-opening part OP-ISC may overlap the anode electrode AE of the organic light emitting device OLED (see FIG. 4). Accordingly, light generated by the organic light emitting device OLED (see FIG. 4) may be emitted to the outside through the touch-opening part OP-ISC.

Figure 11:
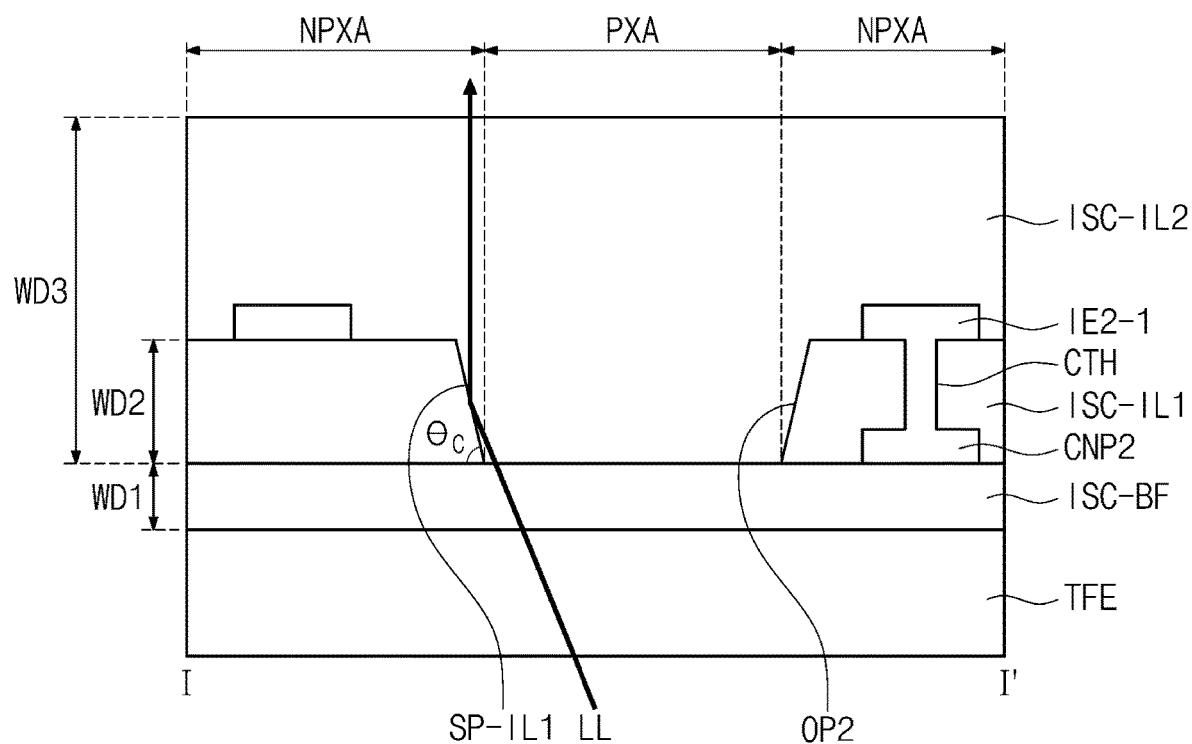
FIG. 11 exemplarily shows a cross-section taken along the line I-I' of FIG. 9.

FIG. 11 exemplarily shows a cross-section taken along the line I-I' of FIG. 9.

The refractive index (hereinafter, the first refractive index) of the first insulating layer ISC-IL1 ranges from about 1.45 to about 1.55. The refractive index (hereinafter, the second refractive index) of the second insulating layer ISC-IL2 ranges from about 1.60 to about 1.70. In other words, the second refractive index may be greater than the first refractive index. In an embodiment of the inventive concept, the difference between the second refractive index and the first refractive index ranges from about 0.1 to about 0.25.

A second opening part OP2 corresponding to the pixel area PXA may be defined in the first insulating layer ISC-IL1. Referring to FIG. 6, the second opening part OP2 of the first insulating layer ISC-IL1 may correspond to the first opening part OP1 of the pixel defining layer PDL.

The first insulating layer ISC-IL1 may include a through surface SP-IL1 defining the second opening part OP2. The angle θc formed by the through surface SP-IL1 with the silicon-buffer layer ISC-BF or the sealing layer TFE ranges from about 60 degrees to about 80 degrees.

As described above, since the second refractive index is greater than the first refractive index, and the through surface SP-IL1 forms a predetermined angle θc with the silicon-buffer layer ISC-BF or the sealing layer TFE, the light LL, emitted by the organic light emitting device OLED (see FIG. 6) may be reflected from the through surface SP-IL1 to be emitted to the front.

When the difference between the second refractive index and the first refractive index is less than 0.1, it may be difficult to generate the above-mentioned reflection phenomenon. When the difference between the second refractive index and the first refractive index is greater than 0.25, due to the difference in physical properties between the first insulating layer ISC-IL1 and the second insulating layer ISC-IL2, a peeling phenomenon may occur between the insulating layers ISC-IL1 and ISC-IL2.

When the angle θc formed by the through surface SP-IL1 with the silicon-buffer layer ISC-BF or the sealing layer TFE is less than 60 degrees or greater than 80 degrees, the light LL may not be reflected in the front direction.

In an embodiment of the inventive concept, the thickness WD1 (or first thickness) of the silicon-buffer layer ISC-BF ranges from about 190 nm to about 210 nm.

In an embodiment of the inventive concept, the thickness WD2 (or second thickness) of the first insulating layer ISC-IL1 ranges from about 1.3 μm to about 1.7 μm.

In an embodiment of the inventive concept, the thickness WD3 (or third thickness) of the second insulating layer ISC-IL2 ranges from about 4 μm to about 5.5 μm.

In an embodiment of the inventive concept, the third thickness WD3 may be at least three times the second thickness WD2. When the third thickness WD3 is at least three times the second thickness WD2, the second insulating layer ISC-IL2 may fill the second opening part OP2 and provide a flat top surface at the same time.

Although described with reference to embodiments, those skilled in the art will appreciate that various modifications and changes may be made to the inventive concept within the scope not departing from the spirit and scope of the inventive concept described in the following claims. In addition, the embodiments disclosed in the inventive concept are not intended to limit the technical idea of the inventive concept, and all technical ideas within the scope of the following claims and equivalents should be construed as being included in the scope of the inventive concept.

INDUSTRIAL APPLICABILITY

As portability of electronic devices including display devices becomes important, power management is becoming very important to use limited battery capacity more efficiently.

When the light efficiency of the display device is low, power management may be difficult and display quality may be deteriorated due to a large amount of power consumption.

Accordingly, the inventive concept for improving the light efficiency of a display device has a high industrial applicability.

The invention claimed is:

1. A display device comprising:
    a display panel including a plurality of anode electrodes disposed on a base layer, a pixel defining layer disposed on the base layer in which a plurality of first opening parts exposing the plurality of anode electrodes are defined, and a sealing layer disposed on the pixel defining layer; and
    an input sensor disposed on the display panel,
    wherein the input sensor comprises:
    a first conductive pattern disposed on the sealing layer;
    a first insulating layer disposed on the sealing layer to cover the first conductive pattern, including a plurality of second opening parts defined to respectively correspond to the plurality of first opening parts, wherein the first insulating layer includes a first organic material, and has a first refractive index;
    a second conductive pattern disposed on the first insulating layer; and
    a second insulating layer configured to cover the second conductive pattern and the first insulating layer, wherein the second insulating layer includes a second organic material, and has a second refractive index, wherein the second refractive index is greater than the first refractive index.

2. The display device of claim 1, wherein a through-hole exposing at least a portion of the first conductive pattern is defined in the first insulating layer, and
wherein the second conductive pattern and the first conductive pattern are electrically connected through the through-hole.

3. The display device of claim 2, wherein the second conductive pattern comprises a plurality of first sensors, a first connection pattern electrically connecting two adjacent first sensors among the plurality of first sensors, and a plurality of second sensors electrostatically coupled to the plurality of first sensors, and
wherein the first conductive pattern comprises a second connection pattern electrically connecting two adjacent second sensors among the plurality of second sensors.

4. The display device of claim 3, wherein a plurality of touch-opening parts each overlapping with the anode electrodes are defined in the plurality of first sensors and the plurality of second sensors.

5. The display device of claim 1, wherein the first refractive index of the first insulating layer ranges from about 1.45 to about 1.55, and
wherein the second refractive index of the second insulating layer ranges from about 1.60 to about 1.70.

6. The display device of claim 5, wherein a difference between the second refractive index and the first refractive index ranges from about 0.1 to about 0.25.

7. The display device of claim 1, wherein each of the first organic material and the second organic material is an acrylic resin.

8. The display device of claim 7, wherein the second insulating layer further comprises zirconia.

9. The display device of claim 1, wherein a thickness of the first insulating layer ranges from about 1.3 μm to 1.7 μm,
wherein a thickness of the second insulating layer ranges from about 4 μm to 5.5 μm.

10. The display device of claim 1, wherein the input sensor further comprises a buffer layer disposed between the sealing layer and the first insulating layer,
wherein the buffer layer comprises SiNx,
wherein the first conductive pattern is in contact with one surface of the buffer layer.

11. The display device of claim 10, wherein a thickness of the buffer layer ranges from about 190 nm to 210 nm.

12. The display device of claim 1, wherein the first insulating layer comprises a through-surface defining each of the plurality of second opening parts,
wherein an angle formed by the through surface with the sealing layer ranges from about 60 degrees to 80 degrees.

13. A display device comprising:
a display panel including a plurality of light emitting devices; and
an input sensor disposed on the display panel,
wherein the input sensor comprises:
a first conductive pattern disposed on a base layer;
a first insulating layer disposed on the base layer to cover the first conductive pattern, including a plurality of opening parts defined to respectively correspond to the plurality of light emitting devices, wherein the first insulating layer includes a first organic material, and has a first refractive index;
a second conductive pattern disposed on the first insulating layer; and
a second insulating layer configured to cover the second conductive pattern and the first insulating layer, wherein the second insulating layer includes a second organic material, and has a second refractive index, wherein the second refractive index is greater than the first refractive index.

14. The display device of claim 13, wherein the first insulating layer comprises a through surface defining each of the plurality of opening parts,
wherein an angle between the through surface and the base layer ranges from about 60 degrees to 80 degrees.

15. The display device of claim 14, wherein the first refractive index of the first insulating layer ranges from about 1.45 to 1.55, and
wherein the second refractive index of the second insulating layer ranges from about 1.60 to about 1.70.

16. The display device of claim 15, wherein a difference between the second refractive index and the first refractive index ranges from about 0.1 to about 0.25.

17. The display device of claim 13, wherein each of the first organic material and the second organic material is an acrylic resin.

18. The display device of claim 17, wherein the second insulating layer further comprises zirconia.

19. The display device of claim 14, wherein a thickness of the first insulating layer ranges from about 1.3 μm to about 1.7 μm, and
wherein a thickness of the second insulating layer ranges from about 4 μm to about 5.5 μm.

20. The display device of claim 14, wherein a through-hole exposing at least a portion of the first conductive pattern is defined in the first insulating layer,
wherein the second conductive pattern and the first conductive pattern are electrically connected through the through-hole,
wherein the second conductive pattern comprises a plurality of first sensors, a first connection pattern electrically connecting two adjacent first sensors among the plurality of first sensors, and a plurality of second sensors electrostatically coupled to the plurality of first sensors, and
wherein the first conductive pattern comprises a second connection pattern electrically connecting two adjacent second sensors among the plurality of second sensors.

* * * * *